(12) United States Patent
Baek et al.

(10) Patent No.: US 7,808,840 B2
(45) Date of Patent: Oct. 5, 2010

(54) METHOD OF OPERATING A NON-VOLATILE MEMORY DEVICE

(75) Inventors: Kwang Ho Baek, Hwaseong-si (KR); Sam Kyu Won, Hwaseong-si (KR); Jae Won Cha, Seoul (KR)

(73) Assignee: Hynix Semiconductor Inc., Icheon-si (KR)

(*) Notice: Subject to any disclaimer, the term of this patent is extended or adjusted under 35 U.S.C. 154(b) by 113 days.

(21) Appl. No.: 12/163,947

(22) Filed: Jun. 27, 2008

(65) Prior Publication Data

US 2009/0052241 A1 Feb. 26, 2009

(30) Foreign Application Priority Data

Aug. 22, 2007 (KR) .................. 10-2007-0084568
May 13, 2008 (KR) .................. 10-2008-0044131

(51) Int. Cl.
*G11C 7/10* (2006.01)

(52) U.S. Cl. .................. 365/189.05; 365/189.17; 365/203

(58) Field of Classification Search ............ 365/189.05, 365/185.17, 203
See application file for complete search history.

(56) References Cited

U.S. PATENT DOCUMENTS 6,996,014 B2 * 2/2006 Lee et al. ............... 365/189.05
7,092,293 B1 * 8/2006 Young et al. ............ 365/185.23

FOREIGN PATENT DOCUMENTS

KR    1020070068002 A    6/2007

* cited by examiner

*Primary Examiner*—Son Dinh
*Assistant Examiner*—Nam Nguyen
(74) *Attorney, Agent, or Firm*—Townsend and Townsend and Crew LLP

(57) ABSTRACT

In a method of operating a non-volatile memory device, a bit line is precharged to a positive voltage, which is input through a common source line of cell strings of memory cells, according to a degree in which a selected memory cell has been programmed. Data according to a voltage level of a sensing node, which is changed according to a level of the voltage of the bit line, is stored in a first latch of a page buffer. The data stored in the first latch is transferred to a second latch through the sensing node.

12 Claims, 6 Drawing Sheets

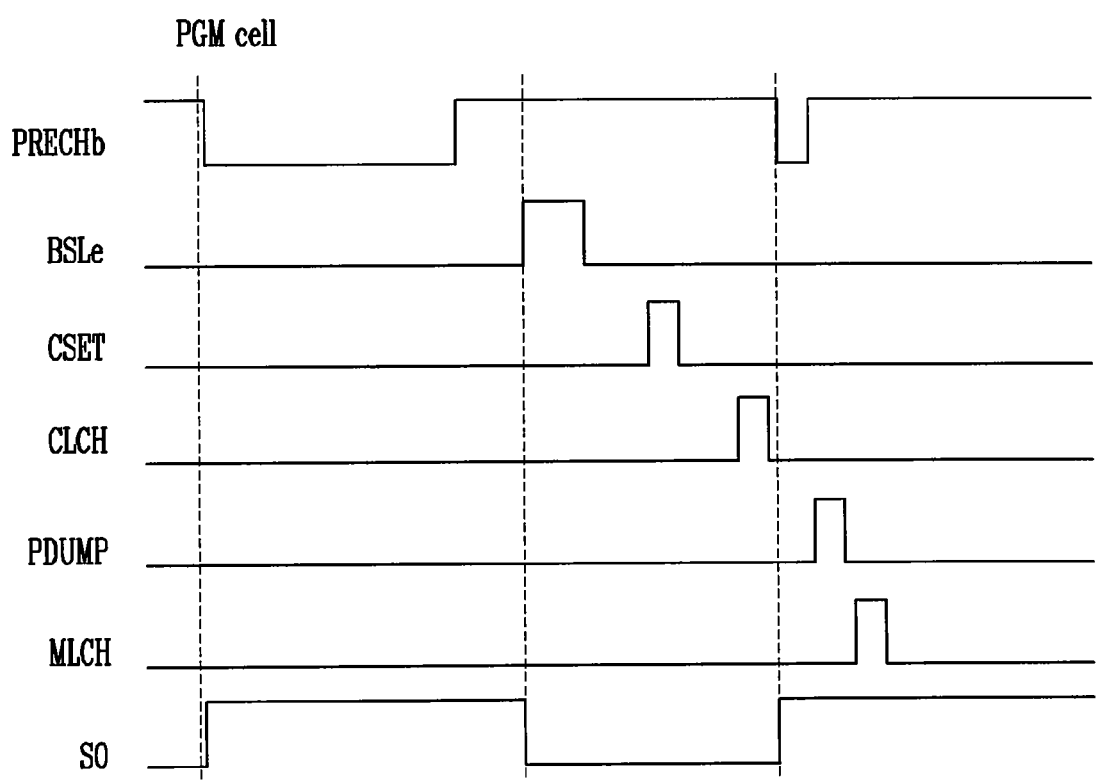

METHOD OF OPERATING A NON-VOLATILE MEMORY DEVICE

CROSS-REFERENCES TO RELATED APPLICATIONS

The present application claims priority to Korean patent application number 10-2007-0084568, filed on Aug. 22, 2007, and Korean patent application number 10-2008-0044131, filed on May 13, 2008, which are incorporated by reference in their entirety.

BACKGROUND OF THE INVENTION

The present invention relates to an operation of a non-volatile memory device and, more particularly, to a method of operating a non-volatile memory device, in which data of a sensing node is inverted and stored.

A well-known NAND flash memory device includes a memory cell array, a row decoder, and a page buffer. The memory cell array consists of a plurality of word lines extending along rows, a plurality of bit lines extending along columns, and a plurality of cell strings corresponding to the bit lines.

A string select line, the word lines, and the row decoder coupled to a common source line are positioned on one side of the memory cell array. The page buffer coupled to the plurality of bit lines is positioned on the other side of the memory cell array.

In recent years, in order to further increase the integration degree of the flash memory device, active research has been conducted on a multi-bit cell that is able to store a plurality of data bits in one memory cell. This type of a memory cell is called a multi-level cell (hereinafter referred to as 'MLC'). A memory cell that stores a single bit of data is called a single level cell (hereinafter referred to as 'SLC').

FIG. 1A shows cell distributions of a SLC memory device.

Referring to FIG. 1A, the SLC has two kinds of erase and program cell states 101, 102 (cell distributions). The erase state 101 of the cells shift to the program cell state 102 according to a program operation (S110). The SLC requires one program operation, as shown in FIG. 1A, and the program operation can be verified by performing one verification operation with respect to a verify voltage PV1.

FIG. 1B shows cell distributions of a MLC memory device.

Referring to FIG. 1B, cell distributions of MLCs are able to store 2-bit data. The cells have cell states 111 to 114 with data storage states [11], [10], [00], and [01]. The distributions correspond to threshold voltage distributions of the MLCs.

Each cell is programmed to have a state from the state [11] (111) to the state [10] (112) by performing a least significant bit (LSB) program operation (S121). A most significant bit (MSB) program operation is performed for the cell to change a state from the state [10] (112) to the state [00] (113) (S131) or to change a state from the state [11] (111) to the state [01] (114) (S132).

After the program operation, verification is performed on the cell. In general, as the number of data bits that can be stored increases, cell distributions increase and, therefore, the number of verifications also increases.

As mentioned earlier, in the case of a SLC, verification is performed on a program 1 pulse. However, in the case of a MLC that is able to store 2-bit data as shown in FIG. 1B, two verification operations are required for a program 1 pulse in a MSB program operation. Similarly, a 3-bit MLC requires three verification operations and a 4-bit MLC requires eight verification operations, with respect to a program pulse.

The number of program verification operations increases as the number of bits that can be stored in a memory cell increases. Thus, the time required for program verification is also increased.

BRIEF SUMMARY OF THE INVENTION

The present invention is directed towards a method of operating a non-volatile memory device, in which, when data is programmed into a memory cell of a flash memory device having a MLC and the programmed cell is verified, the state of a sensing node is inverted and latched.

According to a method of operating a non-volatile memory device in accordance with an aspect of the present invention, a bit line is precharged to a positive voltage according to a degree in which a selected memory cell has been programmed. The positive voltage is input through a common source line of cell strings of memory cells. Data according to a voltage level of a sensing node is stored in a first latch of a page buffer. The data is changed according to a level of the voltage of the bit line. The data stored in the first latch is transferred to a second latch through the sensing node.

With respect to voltage applied to a word line to which the selected memory cell is connected, when the selected memory cell is in a turn-off state, the sensing node changes to a low level.

The precharging of the bit line includes applying a first voltage to a word line to which the selected memory cell is connected and applying a pass voltage to unselected word lines. Thus, the voltage of each of the respective bit lines changes according to a program state of the selected memory cell.

In storing the data according to the voltage level of the sensing node in the first latch, data having a program state opposite to that of a selected word line is stored in the first latch when the second latch is in a disable state.

In transferring the data stored in the first latch to the second latch, the second latch is enabled, and the data stored in the first latch is then transferred to the second latch through the sensing node so that the data according to the program state of the selected memory cell is stored in the second latch.

According to a method of operating a non-volatile memory device in accordance with another aspect of the present invention, a bit line is precharged to a positive voltage according to a degree of a memory cell that has been programmed. The positive voltage is input through a common source line of cell strings of memory cells. The voltage of the bit line is changed according to a state of data stored in the memory cell. Data according to a level of the voltage of the bit line is stored in a first latch of a page buffer. The data stored in the first latch is transferred to a second latch. A verify signal according to a state of the data transferred to the second latch is then output.

When the memory cell has been programmed, the sensing node changes to a low level.

The precharging of the bit line includes programming MLCs of the memory device; for program verification, applying a positive voltage to a common source line commonly connected to cell strings to which the MLCs are connected; and applying a first voltage to a selected one of a plurality of word lines, which crosses the cell strings of the MLCs and is connected to the cell strings, and applying a pass voltage to unselected word lines.

A sensing node connected to the precharged bit line has a state precharged to a high level.

Before data of the sensing node is latched, the first and second latches of the page buffer are reset.

In storing the data according to the voltage level of the bit line in the first latch, the second latch is enabled and data, having a logic level opposite to the voltage level of the bit line, is stored in the first latch.

In transferring the data stored in the first latch to the second latch, the second latch is enabled, and the data stored in the first latch is transferred to the second latch through the sensing node.

BRIEF DESCRIPTION OF THE DRAWINGS

FIG. 3B is a timing diagram showing the sensing operation of a programmed cell in accordance with an embodiment of the present invention.

DESCRIPTION OF SPECIFIC EMBODIMENTS

Specific embodiments according to the present invention will be described with reference to the accompanying drawings. However, the present invention is not limited to the disclosed embodiments, but may be implemented in various ways. The embodiments are provided to complete the disclosure of the present invention and to allow those having ordinary skill in the art to understand the present invention. The present invention is defined by the scope of the claims.

Figure 1A:
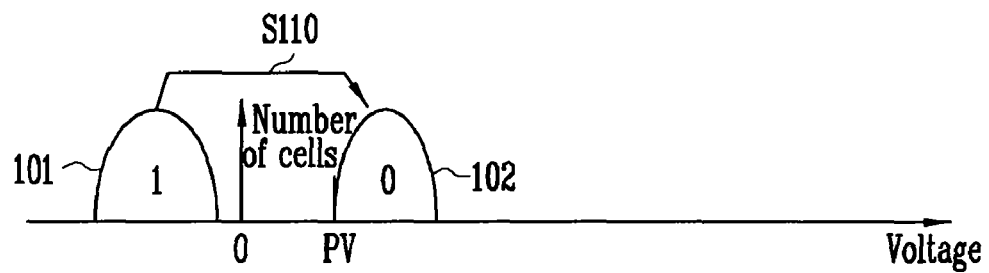
FIG. 1A shows cell distributions of a SLC memory device.
Figure 1B:
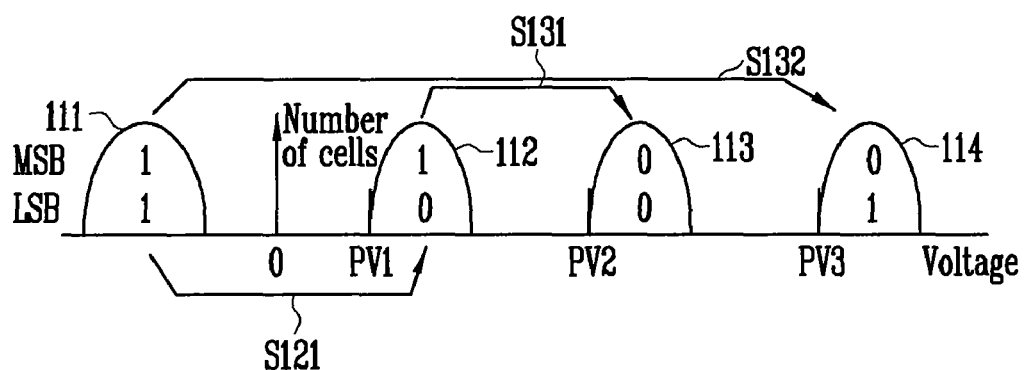
FIG. 1B shows cell distributions of a MLC memory device.
Figure 2A:
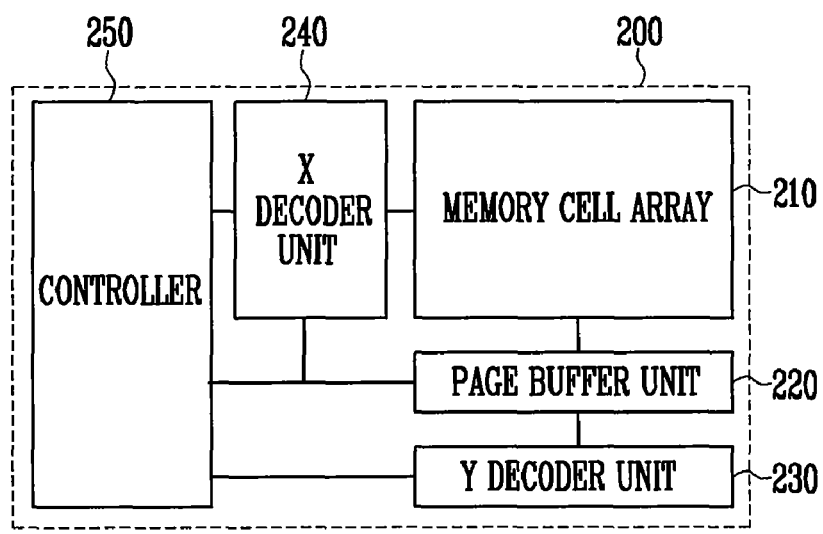
FIG. 2A is a block diagram showing the structure of a MLC memory device in accordance with an embodiment of the present invention.

FIG. 2A is a block diagram showing the structure of a MLC memory device in accordance with an embodiment of the present invention.

Referring to FIG. 2A, a MLC memory device 200 in accordance with an embodiment of the present invention includes a memory cell array 210 comprising MLCs, a page buffer unit 220 including a plurality of page buffers for performing data program, verification and read operations on the MLCs of the memory cell array 210, a Y decoder unit 230 for selecting the page buffers in response to an input address, a X decoder unit 240 for selecting word lines of the memory cell array 210 in response to an input address, and a controller 250 for controlling an operation of the MLC memory device 200.

The memory cell array 210 includes MLC arrays divided by the word lines and bit lines. The page buffer unit 220 includes a page buffer circuit connected to a pair of the bit lines of the memory cell array 210 and is configured to perform data program, verification and read operations.

The Y decoder unit 230 and the X decoder unit 240 connect MLCs of the memory cell array 210 for program or read operations under the control of the controller 250.

The controller 250 performs voltage level control, operating signal control, etc. for the program, verification or read operation and the erase operation of the MLC memory device 200.

The memory cell array 210 includes a plurality of bit line pairs which are described below.

Figure 2B:
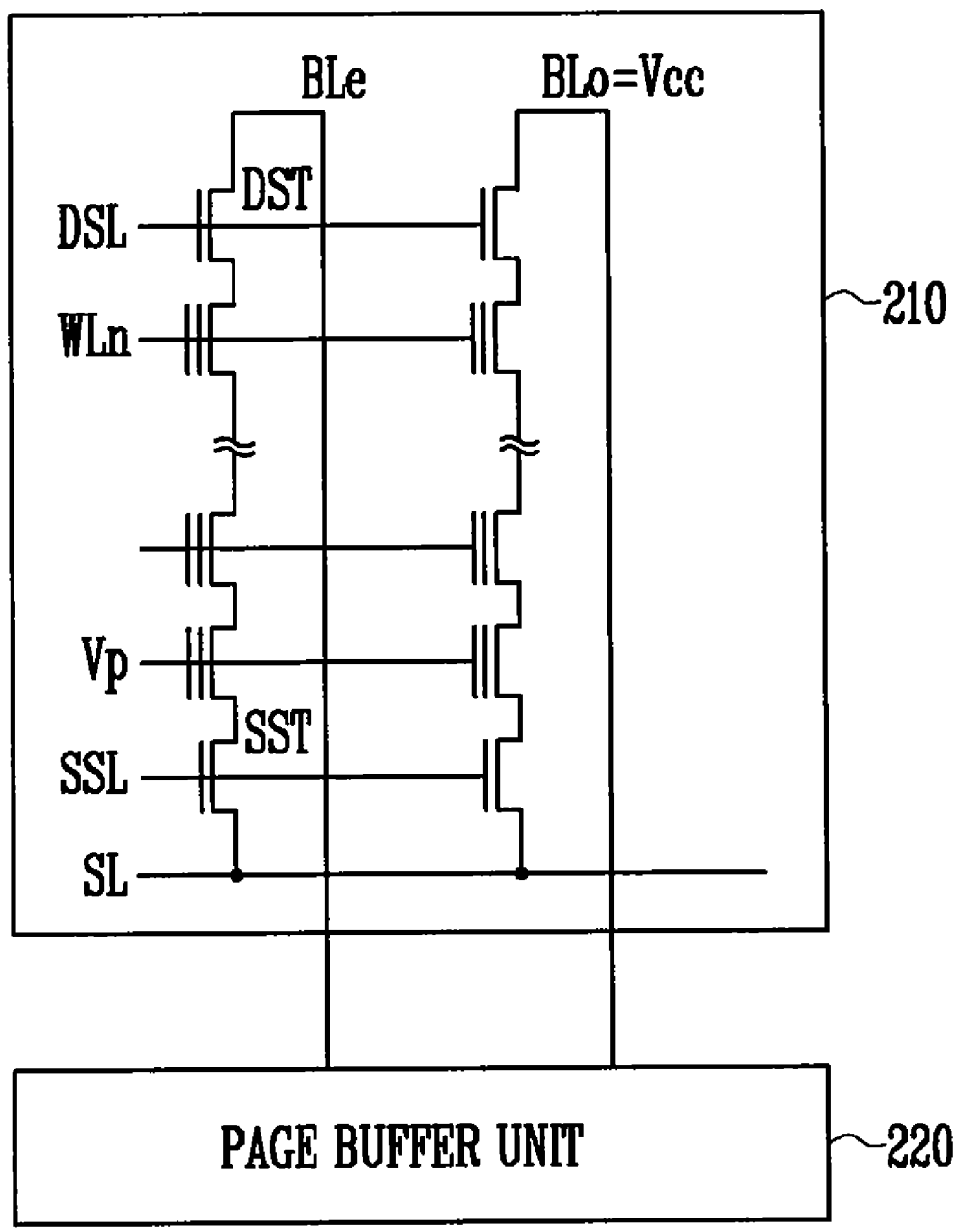
FIG. 2B is a partial circuit diagram of a memory cell array shown in FIG. 2A.

FIG. 2B is a partial circuit diagram of the memory cell array shown in FIG. 2A.

Referring to FIG. 2B, a bit line pair of the memory cell array 210 includes an even bit line BLe and an odd bit line BLo. A cell string is coupled to each bit line.

The bit lines of the memory cell array 210 are connected to the cell strings to which the memory cells are connected in series.

Each cell string includes a plurality of memory cells connected in series between a drain select transistor DST and a source select transistor SST.

Gates of the drain select transistors of the cell strings are commonly connected by a drain select line DSL. Gates of the source select transistors are connected by a source select line SSL.

Source lines of the source select transistors are connected by a common source line SL. The common source line SL is generally connected to a ground node. During a verify operation performed after a program operation, a power supply voltage Vcc is input to the common source line SL.

For example, after a memory cell C coupled to the even bit line BLe is programmed and verified, a default voltage is applied to the memory cell C selected for program and a pass voltage is applied to the remaining cells. The voltage applied to the selected memory cell is a voltage which can turn on the memory cell even when the cell has been programmed to have the highest threshold voltage.

When the power supply voltage Vcc is applied to the common source line SL, the even bit line BLe is precharged according to the degree in which a selected memory cell has been programmed, that is, the threshold voltage. If the threshold voltage of the selected memory cell is low, the even bit line BLe is precharged to a high voltage. When the threshold voltage of the selected memory cell is high, the even bit line BLe is precharged to a low voltage. That is, the even bit line BLe is precharged to a voltage level in which the threshold voltage of the selected memory cell is subtracted from the power supply voltage Vcc input through the common source line SL.

The odd bit line BLo is also applied with the power supply voltage Vcc in order to avoid this influence.

When the power supply voltage Vcc is applied through the common source line SL and the even bit line BLe is precharged as described above, the precharge voltage of the even bit line BLe is in inverse proportion to the threshold voltage of the memory cell.

Thus, if the memory cell C has been programmed to have a high threshold voltage, a voltage level transferred to the sensing node SO has a substantially '0' logic level. If the memory cell C is an erased cell, a voltage level transferred to the sensing node SO has a logic level of '1'. Such a change in the voltage level of the sensing node SO is opposite to the operation of an existing page buffer circuit. Accordingly, it is necessary to invert a value of the sensing node SO, which is changed to have an opposite level to that of an existing program verify operation. The inverted value is then stored in a latch.

The verify method can also be applied when data is read. Thus, when the value of the sensing node SO is inverted and latched even when data is read, data normally programmed into a memory cell can be read and output.

Accordingly, in the following page buffer circuit, a method of inverting and latching a voltage level of the sensing node SO without an additional change of a circuit is described below.

Figure 2C:
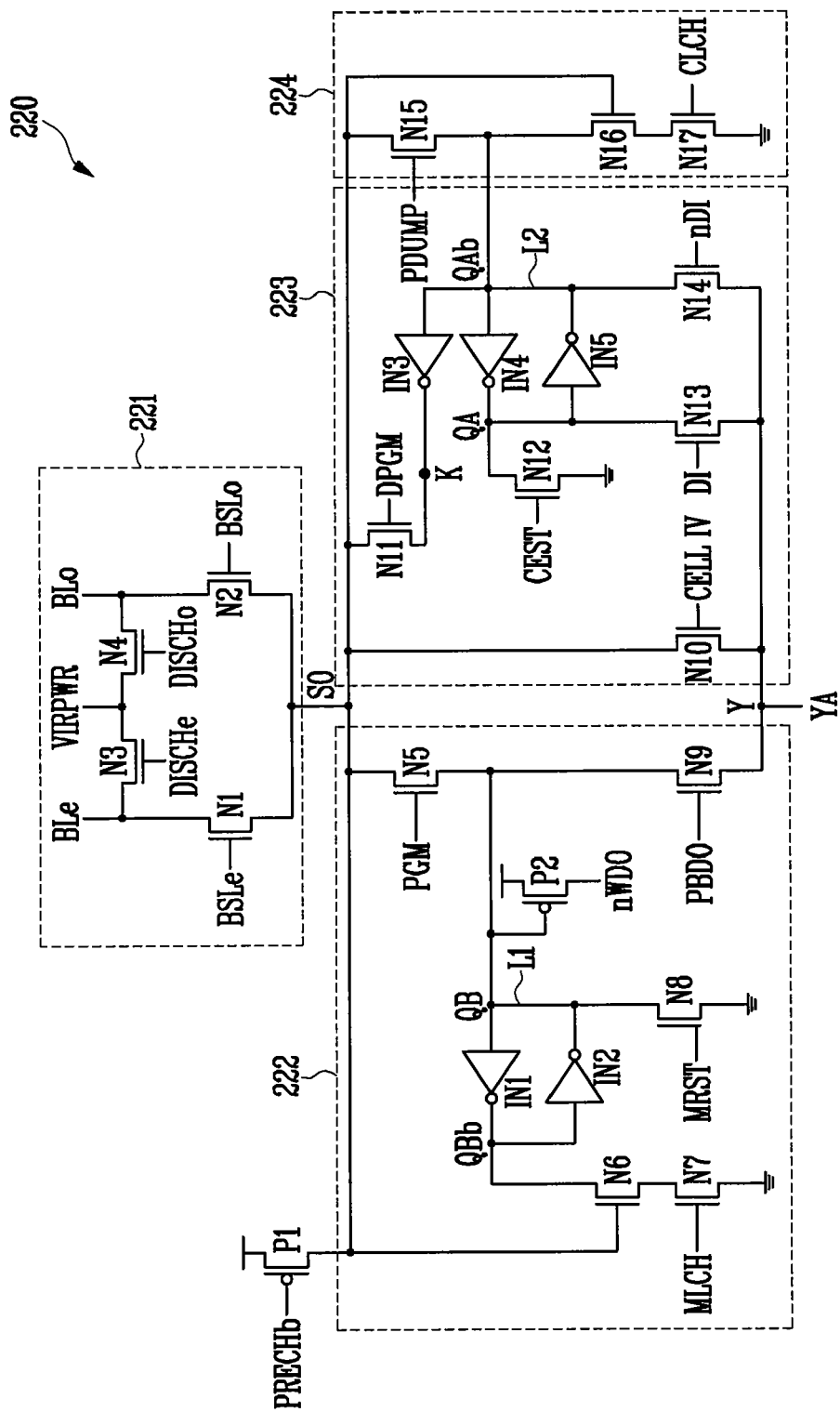
FIG. 2C is a detailed circuit diagram of a page buffer circuit shown in FIG. 2A.

FIG. 2C is a detailed circuit diagram of the page buffer circuit shown in FIG. 2A.

Referring to FIG. 2C, the page buffer circuit in accordance with an embodiment of the present invention includes a bit line select unit 221, first and second latch units 222, 223, and a data inversion unit 224. The bit line select unit 221 selects the even bit line BLe or the odd bit line BLo, senses a precharge voltage level of a selected bit line, and connects the precharge voltage level to the sensing node SO. The first and second latch units 222, 223 are coupled to the sensing node SO, and temporarily store data to be programmed into a memory cell or read data programmed into the memory cell. The data inversion unit 224 is coupled to the sensing node SO, and inverts data read from the memory cell and transfers the inverted data to the second latch unit 223.

The page buffer circuit further includes a first PMOS transistor P1 for precharging the sensing node SO. The first PMOS transistor P1 is operated in response to a precharge control signal PRECHb.

The bit line select unit 221 includes first to fourth NMOS transistors N1 to N4.

The first latch unit 222 includes fifth to ninth NMOS transistors N5 to N9, first and second inverters N1, IN2, and a second PMOS transistor P2. The second latch unit 223 includes tenth to fourteenth NMOS transistors N10 to N14, and third to fifth inverters IN3 to IN5. The data inversion unit 224 includes fifteenth to seventeenth NMOS transistors N15 to N17.

The first NMOS transistor N1 of the bit line select unit 221 is connected between the even bit line BLe and the sensing node SO. A bit line select signal BSLe is applied to the gate of the first NMOS transistor N1. The second NMOS transistor N2 is connected between the odd bit line BLo and the sensing node SO. A bit line select signal BSLo is applied to the gate of the second NMOS transistor N2.

The third and fourth NMOS transistors N3, N4 are connected between the even and odd bit lines BLe, BLo. A power signal VIRPWR is input to a contact node of the third NMOS transistor N3 and the fourth NMOS transistor N4. Discharge control signals DISCHe, DISCHo are applied to the gates of the third and fourth NMOS transistors N3, N4, respectively.

The fifth NMOS transistor N5 of the first latch unit 222 is connected between the sensing node SO and a node QB. A first program control signal PGM is applied to the gate of the fifth NMOS transistor N5.

The sixth and seventh NMOS transistors N6, N7 are connected in series between a node QBb and a ground node. The sensing node SO is connected to the gate of the sixth NMOS transistor N6. A control signal MLCH is applied to the gate of the seventh NMOS transistor N7.

The eighth NMOS transistor N8 is connected between the node QB and the ground node. A reset control signal MRST is applied to the gate of the eighth NMOS transistor N8.

The first and second inverters IN1, IN2 are connected between the node QBb and the node QB, and constitute a first latch L1. The second PMOS transistor P2 outputs the power supply voltage as a verify signal nWD0 according to a voltage level of the node QB.

The ninth NMOS transistor N9 is connected between the node QB and a node YA. A data output control signal PBDO is applied to the gate of the ninth NMOS transistor N9.

The tenth NMOS transistor N10 of the second latch unit 223 is connected between the sensing node SO and the node YA. A control signal CELL IV is applied to the gate of the tenth NMOS transistor N10.

The eleventh NMOS transistor N11 is connected between the sensing node SO and a node K. A second program control signal DPGM is applied to the gate of the eleventh NMOS transistor N11. The third inverter IN3 is connected between the node K and a node QAb, and inverts a logic level of the node QAb and outputs an inverted logic level to the node K.

The fourth and fifth inverters IN4, IN5 are connected between a node QA and the node QAb, and constitute a second latch L2. The twelfth NMOS transistor N12 is connected between the node QA and a ground node. A setting control signal CSET is applied to the gate of the twelfth NMOS transistor N12.

The thirteenth NMOS transistor N13 is connected between the node QA and the node YA. The fourteenth NMOS transistor N14 is connected between the node QAb and the node YA. Data input control signals DI, nDI are input to the gates of the thirteenth and fourteenth NMOS transistors N13, N14, respectively.

The fifteenth NMOS transistor N15 of the data inversion unit 224 is connected between the sensing node SO and the node QAb. A control signal PDUMP is applied to the gate of the fifteenth NMOS transistor N15.

The sixteenth and seventeenth NMOS transistors N16, N17 are connected in series between the node QAb and a ground. The sensing node SO is connected to the gate of the sixteenth NMOS transistor N16. A control signal CLCH is connected to the gate of the seventeenth NMOS transistor N17.

A timing diagram of each control signal according to a program verify operation of the memory device constructed above in accordance with an embodiment of the present invention is described below.

Figure 3A:
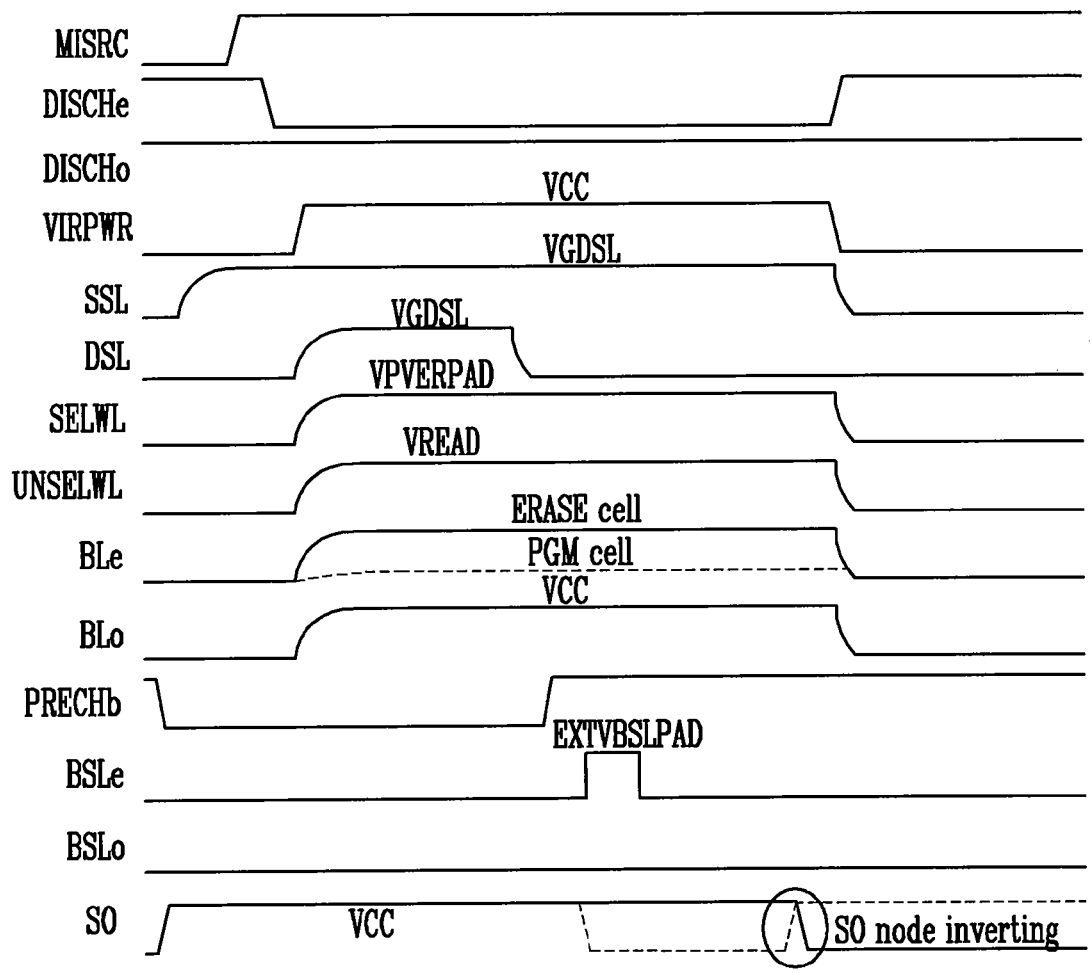
FIG. 3A is an operating timing diagram of the flash memory device in accordance with an embodiment of the present invention.
Figure 3C:
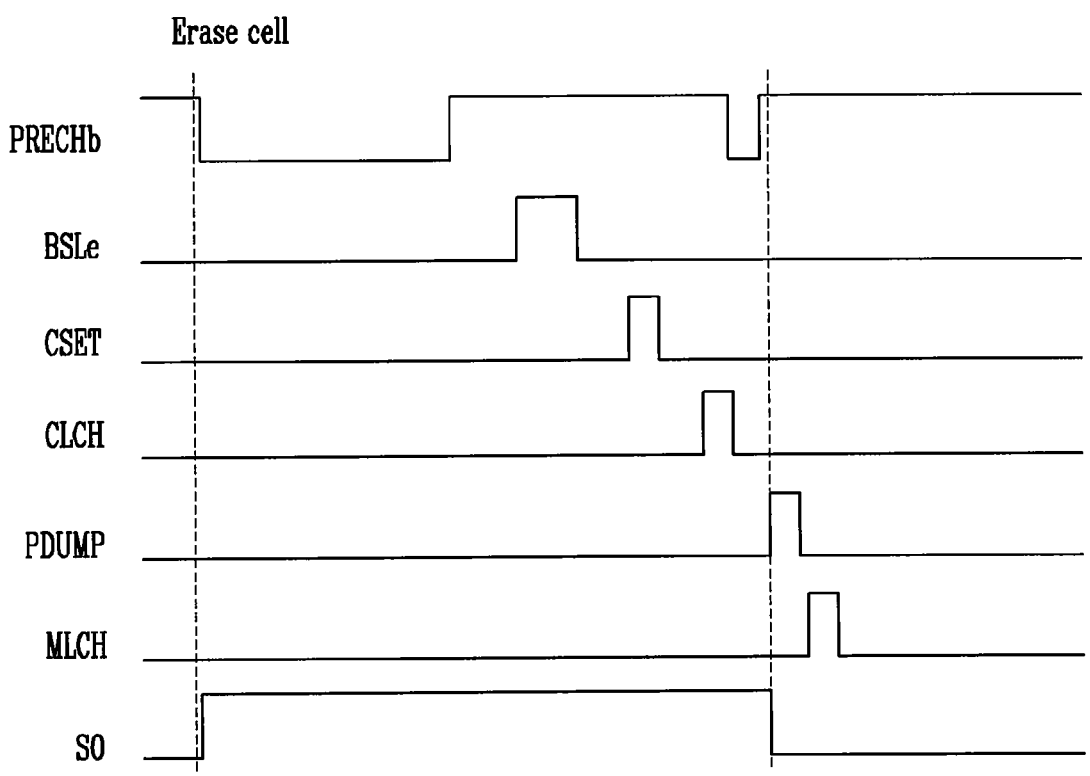
FIG. 3C is a timing diagram of the sensing operation of an erased cell in accordance with an embodiment of the present invention.

FIG. 3A is an operating timing diagram of the flash memory device in accordance with an embodiment of the present invention. FIG. 3B is a timing diagram showing the sensing operation of a programmed cell in accordance with an embodiment of the present invention. FIG. 3C is a timing diagram of the sensing operation of an erased cell in accordance with an embodiment of the present invention.

A detailed operation is described below with reference to the timing diagrams of FIGS. 3A to 3C and FIGS. 2B and 2C. The program verify operation and the data read operation of the non-volatile memory device differ in voltages applied to the word lines, but are performed similarly and, therefore, only the program verify operation will be described.

First, the even bit line BLe is selected and the memory cell C is programmed.

For program verification, the control signal is applied as shown in FIG. 3A. First, the even bit line BLe is selected. For verification, the signals DSL, SSL for turning off the drain select transistor DST and the source select transistor SST of a cell string are applied and the pass voltage is applied to unselected word lines on which verification will not be performed, thereby turning off cells.

The highest voltage among verify voltages is applied to a selected word line for verification. That is, in an embodiment of the present invention, in the case of a 2-bit MLC, a voltage set for verification of the state [01] having the highest threshold voltage is applied.

Specifically, for example, in the case of MLCs having four kinds of threshold voltage distributions [11], [10], [00], and [01], when all of the cells are programmed, it is assumed that the cells have a threshold voltage lower than a voltage Vp. Accordingly, a first cell C0 selected according to an embodiment of the present invention is applied with the voltage Vp. The reason why the voltage Vp is applied to the selected word line is that, if the level of the voltage applied to the selected word line is too low, cells having a high threshold voltage distribution may not be turned on due to the characteristics of a flash memory device on which program and verification are performed on a per page basis. Thus, discharging of a bit line in accordance with an embodiment of the present invention becomes difficult. This is because even cells having the highest threshold voltage distributions can be turned on.

The power supply voltage Vcc is applied through the common source line SL according to the program verify operation. The even bit line BLe is precharged to the power supply voltage Vcc that is applied through the common source line SL according to a program state of the memory cell C.

That is, the even bit line BLe is precharged to a voltage which has been lowered from the power supply voltage Vcc as much as the threshold voltage of the memory cell C.

The first NMOS transistor N1 of the page buffer unit 221 is turned on to connect the sensing node SO and the even bit line BLe. When the sensing node SO and the even bit line BLe are connected, the level of the voltage of the bit line, which is transferred to the sensing node SO, is changed according to the program state of the memory cell C.

The page buffer circuit is then reset. To this end, the reset control signal MRST and the setting control signal CSET of a high level are applied, thereby turning on the eighth NMOS transistor N8 and the twelfth NMOS transistor N12. When the eighth NMOS transistor N8 is turned on, the node QB is connected to the ground node and thereby becomes a low level. Further, the second PMOS transistor P2 is turned on, such that the verify signal nWD0 is output. When the twelfth NMOS transistor N12 is turned on, the node QA is connected to the ground node and then reset to a low level. The node QAb becomes a high level.

Further, since the precharge control signal PRECHb of a low level is input to turn on the first PMOS transistor P1, the sensing node SO is precharged to a high level.

Thereafter, the bit line select signal BSLe is applied, such that the even bit line BLe and the sensing node SO are connected. If the memory cell C has been programmed to have a high threshold voltage, the level of voltage transferred to the sensing node SO becomes a logic level of substantially '0'. If the memory cell C is an erased cell, the level of the voltage transferred to the sensing node SO has a logic level of '1'.

An operation of the page buffer when the memory cell C is a programmed cell can be performed as follows according to the application of the control signal of FIG. 3B.

When the memory cell C is a programmed cell, the sensing node SO has a logic level of substantially '0' and, therefore, the sixteenth NMOS transistor N16 maintains a turn-off state. Thus, although the seventeenth NMOS transistor N17 is turned on by applying the control signal CLCH of a high level to read the sensing node SO, the node QAb maintains a high level since the sixteenth NMOS transistor N16 is in a turn-off state. Moreover, if the second program control signal PDUMP of a high level is applied, the high level state of the node QAb is applied to the gate of the sixth NMOS transistor N6 through the sensing node SO. Consequently, the sixth NMOS transistor N6 is turned on.

When the control signal MLCH of a high level is input to turn on the seventh NMOS transistor N7, the node QBb is connected to the ground node, thereby becoming a low level. The node QB becomes a high level. When the node QB becomes a high level, the second PMOS transistor P2 is turned off. Accordingly, it can be determined that the cell has been programmed since the verify signal nWD0 is not output.

An operation of the page buffer when the memory cell C is an erased cell can be performed as follows according to the application of the control signal of FIG. 3C.

When the memory cell C is an erased cell, the sensing node SO becomes a high level and, therefore, the sixteenth NMOS transistor N16 is turned on. Further, when the control signal CLCH of a high level is input, the seventeenth NMOS transistor N17 is also turned on.

Thus, the node QAb is connected to the ground node and becomes a low level. Further, when the second program control signal PDUMP of a high level is input, the fifteenth NMOS transistor N15 is turned on.

When the fifteenth NMOS transistor N15 is turned on, the low level state of the node QAb is input to the gate of the sixth NMOS transistor N6. Thus, the sixth NMOS transistor N6 maintains a turn-off state.

When the control signal MLCH is input, the seventh NMOS transistor N7 is turned on. However, since the sixth NMOS transistor N6 is in a turn-off state, the node QBb maintains an initial high level without change, and the node QB also maintains an initial low level.

When the node QB is a low level, the second PMOS transistor P2 is turned on. Thus, the verify signal nWD0 is continuously output, and it can be determined that the cell is an erased cell.

As described above, when performing program verification of a memory cell using the power supply voltage input through the common source line, a logic level of data of the sensing node SO can be inverted and latched. Accordingly, in a program verification process employing a method of precharging the bit line through the common source line or when data is read, a voltage level of a general sensing node can be inverted. Accordingly, data read and verification operations can be performed by inverting and latching the voltage level without an additional circuit change of the page buffer.

As described above, according to the method of operating a non-volatile memory device in accordance with the present invention, when data is read after precharging the bit line by inputting the power supply voltage through the common source line, data of the sensing node can be inverted and latched in the page buffer without a change of the page buffer circuit.

The embodiments disclosed herein have been proposed to allow a person skilled in the art to easily implement the present invention, and the person skilled in the part may implement the present invention by a combination of these embodiments. Therefore, the scope of the present invention is not limited by or to the embodiments as described above, and should be construed to be defined only by the appended claims and their equivalents.

What is claimed is:

1. A method of operating a non-volatile memory device having a plurality of cell strings and a plurality of page buffers, the cell strings connected between a common source line and a plurality of bit lines, the cell strings including a plurality of memory cells, each of the memory cells having a gate that is connected to a word line of a plurality of word lines, and each of the page buffers having a first latch and a second latch which are coupled to the bit lines through a sensing node, the method comprising:
   precharging the bit lines based on a program state of a selected memory cell by supplying a positive voltage to the common source line;
   storing data according to a voltage level of the sensing node in the first latch of a page buffer, wherein the voltage level of the sensing node is changed according to a level of the voltage of the bit line; and
   transferring the data stored in the first latch to the second latch through the sensing node.

2. The method of claim 1, wherein, with respect to voltage applied to a word line to which the selected memory cell is connected, when the selected memory cell is in a turn-off state, the sensing node changes to a low level.

3. The method of claim 1, wherein the precharging of the bit line comprises:
   applying a first voltage to a word line to which the selected memory cell is connected; and
   applying a pass voltage to unselected word lines, such that the voltage of each of the respective bit lines changes according to a program state of the selected memory cell.

4. The method of claim 1, wherein, in storing the data according to the voltage level of the sensing node in the first latch, data having a program state opposite to that of a selected word line is stored in the first latch when the second latch is in a disable state.

5. The method of claim 1, wherein, in transferring the data stored in the first latch to the second latch, the second latch is enabled, and the data stored in the first latch is transferred to the second latch through the sensing node such that the data according to the program state of the selected memory cell is stored in the second latch.

6. A method of operating a non-volatile memory device having a plurality of cell strings and a plurality of page buffers, the cell strings connected between a common source line and a plurality of bit lines, the cell strings including a plurality of memory cells, each of the memory cells having a gate that is connected to a word line of a plurality of word lines, and each of the page buffers having a first latch and a second latch which are coupled to the bit lines through a sensing node, the method comprising:
   precharging the bit lines based on a program state of a selected memory cell by supplying a positive voltage to the common source line;
   storing data according to a level of the voltage of the bit line in the first latch of a page buffer;
   transferring the data stored in the first latch to the second latch; and
   outputting a verify signal according to a state of the data transferred to the second latch.

7. The method of claim 6, wherein, when the memory cell is programmed, the sensing node changes to a low level.

8. The method of claim 6, wherein the precharging of the bit line comprises:
   programming multi-level cells (MLCs) of the memory device;
   for program verification, applying a positive voltage to the common source line commonly connected to cell strings to which the MLCs are connected;
   applying a first voltage to a selected one of the plurality of word lines, wherein the plurality of the word lines crosses the cell strings of the MLCs and is connected to the cell strings; and
   applying a pass voltage to unselected word lines of the plurality of word lines.

9. The method of claim 6, wherein a sensing node connected to the precharged bit line has a state precharged to a high level.

10. The method of claim 6, wherein, before data of the sensing node is latched, the first and second latches of the page buffer are reset.

11. The method of claim 6, wherein, in storing the data according to the voltage level of the bit line in the first latch, the second latch is enabled and data having a logic level opposite to the voltage level of the bit line is stored in the first latch.

12. The method of claim 11, wherein, in transferring the data stored in the first latch to the second latch, the second latch is enabled, and the data stored in the first latch is transferred to the second latch through the sensing node.

* * * * *